US012685216B2

(12) United States Patent
Wang et al.

(10) Patent No.: US 12,685,216 B2
(45) Date of Patent: Jul. 14, 2026

(54) COMPOSITE IC DIE PACKAGE INCLUDING IC DIE DIRECTLY BONDED TO FRONT AND BACK SIDES OF AN INTERPOSER

(71) Applicant: Intel Corporation, Santa Clara, CA (US)

(72) Inventors: Junxin Wang, Chandler, AZ (US); Whitney Bryks, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 317 days.

(21) Appl. No.: 17/389,649

(22) Filed: Jul. 30, 2021

(65) Prior Publication Data

US 2023/0034737 A1    Feb. 2, 2023

(51) Int. Cl.
  H10W 70/09     (2026.01)
  H10W 70/60     (2026.01)
  H10W 70/685    (2026.01)
  H10W 90/00     (2026.01)
  *H10W 80/00*     (2026.01)

(52) U.S. Cl.
  CPC ........... H10W 90/00 (2026.01); H10W 70/09 (2026.01); H10W 70/611 (2026.01); H10W 70/685 (2026.01); H10W 70/60 (2026.01); *H10W 80/00* (2026.01); *H10W 90/794* (2026.01)

(58) Field of Classification Search
  CPC ............. H01L 27/0688; H01L 25/0652; H01L 2225/06541; H01L 23/5389; H10B 80/00
  See application file for complete search history.

(56) References Cited

U.S. PATENT DOCUMENTS

| | | | | |
|---|---|---|---|---|
| 9,123,763 B2 * | 9/2015 | Yu | ...................... | H10W 74/019 |
| 9,543,965 B1 * | 1/2017 | Ding | ......................... | H03L 7/04 |
| 12,165,981 B2 * | 12/2024 | Loh | ......................... | G05F 1/575 |
| 2011/0234249 A1 * | 9/2011 | Uematsu | ............ | G01R 31/2889 |
| | | | | 324/754.18 |
| 2012/0083116 A1 * | 4/2012 | Yang | ................. | H01L 23/53238 |
| | | | | 438/653 |
| 2013/0040451 A1 * | 2/2013 | Dragoi | .................... | H01L 24/03 |
| | | | | 438/597 |

(Continued)

FOREIGN PATENT DOCUMENTS

| | | | | | |
|---|---|---|---|---|---|
| CN | 114497025 A | * | 5/2022 | ......... | H01L 23/3128 |

*Primary Examiner* — William B Partridge
*Assistant Examiner* — Felix B Andrews
(74) *Attorney, Agent, or Firm* — Essential Patents Group, LLP

(57) ABSTRACT

Composite IC die package including IC die on both a first and second side of an interposer. The backside of first IC die are attached, for example through a direct bond, to a first side of the interposer. Redistribution layer (RDL) metal features are then fabricated, for example with semi-additive processes (SAP), to form interconnects to the frontside of the first die that terminate at first-level interconnect (FLI) interfaces. The frontside of second IC are attached, for example through a direct bond, to a second side of the interposer. Through vias in the interposer couple the second IC die to the first IC die and/or the FLI interfaces. Through vias of the interposer may be coupled to pillars on the first side of the interposer with the first IC die positioned between the pillars, facilitating power delivery to the second IC die.

20 Claims, 7 Drawing Sheets

(56)  References Cited

U.S. PATENT DOCUMENTS

| | | | | |
|---|---|---|---|---|
| 2013/0154109 | A1* | 6/2013 | Venkatraman | H01L 23/4926 |
| | | | | 257/E21.135 |
| 2015/0221573 | A1* | 8/2015 | Paek | H10W 72/20 |
| | | | | 438/126 |
| 2017/0040247 | A1* | 2/2017 | Shen | H01L 23/49838 |
| 2019/0012116 | A1* | 1/2019 | Gutala | G06F 3/0632 |
| 2019/0043829 | A1* | 2/2019 | Kelly | H01L 25/0655 |
| 2019/0237430 | A1* | 8/2019 | England | H10P 54/00 |
| 2021/0296231 | A1* | 9/2021 | Karpov | H10W 20/069 |
| 2021/0366833 | A1* | 11/2021 | Huang | H10W 70/614 |
| 2022/0102237 | A1* | 3/2022 | Deng | H01L 23/49827 |
| 2023/0034737 | A1* | 2/2023 | Wang | H10W 90/00 |
| 2023/0260883 | A1* | 8/2023 | Aiba | H10W 70/635 |
| | | | | 257/712 |

* cited by examiner

100

COMPOSITE IC DIE PACKAGE INCLUDING IC DIE DIRECTLY BONDED TO FRONT AND BACK SIDES OF AN INTERPOSER

BACKGROUND

Monolithic integrated circuit (IC) fabrication has restrictions that may limit a final product's performance, and thus different versions of IC die (dis)integration are being investigated. To date however, these techniques and architectures generally suffer drawbacks such as high cost, lower insertion efficiency, and increased z-height.

IC die disintegration techniques rely on advances in multi-die integration at the package level. In electronics manufacturing, IC packaging is a stage of semiconductor device fabrication in which an IC that has been monolithically fabricated on a chip (or die) comprising a semiconducting material is assembled into a "package" that can protect the IC die from physical damage and support electrical contacts that connect the IC die to a scaled host component, such as an organic package substrate, or a printed circuit board. Multiple die or chips can be similarly assembled together, for example, into a multi-chip package (MCP).

Such multi-chip packages may advantageously combine IC die from heterogeneous silicon processes and/or combine small dis-aggregated chips from identical silicon processes. However, there are many challenges with integrating multiple IC chips into such a chip-scale unit. For example, die assembly is limited by surface area of an interposer to which the die are attached. It is difficult to scale up the footprint of an interposer, for example due to basic constraints of reticle stitching and wafer utilization. Hence, many of the same factors motivating dis-integration of IC die also constrain the footprint of interposers.

Accordingly, composite IC die package architectures, and assembly techniques associated with those package architectures, capable of increasing the number of IC die within a package are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
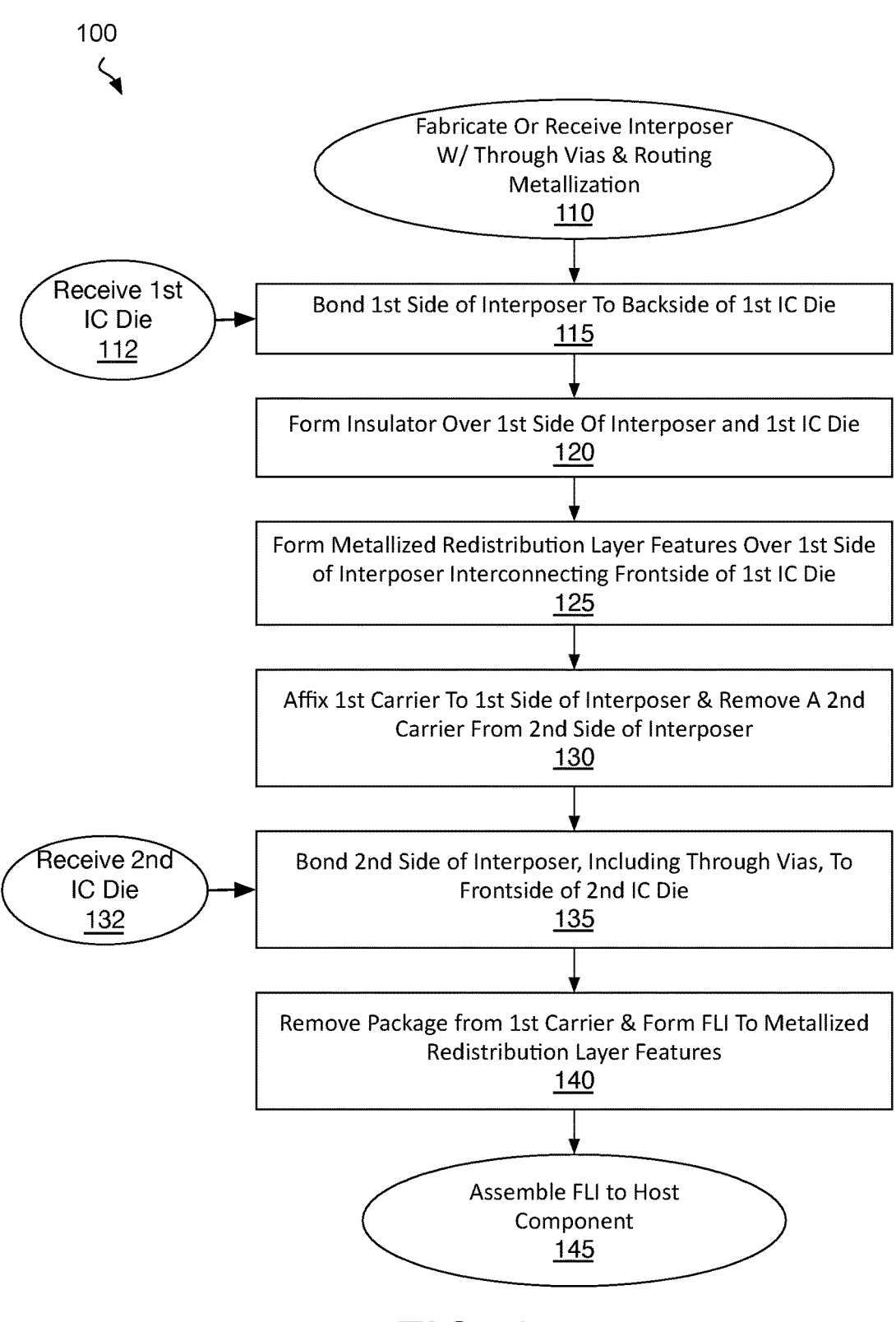
FIG. 1 illustrates a flow diagram of methods for assembling a double-sided interposer into a composite IC die package, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

Composite IC die packages including IC die directly bonded to both sides of a double-side interposer are described below. The composite IC die package examples may be manufactured, in part, with bonding techniques in which metal features embedded within an insulator of an IC die are directly fused to metal features embedded within an insulator of an interposer. Where both the metal features and the insulators are fused, the resultant composite structure comprises a hybrid bonded interface of both metallurgically interdiffused metals and chemically bonded insulators. Prior to bonding, each IC die may be fabricated in a monolithic process separate from that of the interposer. As such, each IC die may utilize the same or different semiconductor device fabrication technologies as various other IC die bonded to the interposer. Likewise, prior to assembly, the interposer may be fabricated according a monolithic process separate from that of the IC die that supports both frontside and backside bonding of IC die.

A number of different assembly and/or fabrication methods may be practiced to form a composite IC die package having one or more of the features or attributes described herein. FIG. 1 illustrates a flow diagram of methods 100 for assembling a double-sided interposer into a composite IC die package, in accordance with some embodiments. Methods 100 begin at input 110, where a double-sided interposer is fabricated, or received as a preform that has been fabricated upstream of methods 100. A plurality of such double-sided interposers may be fabricated monolithically from a substrate, such as a glass or silicon (e.g., monocrystalline) starting wafer.

Figure 2:
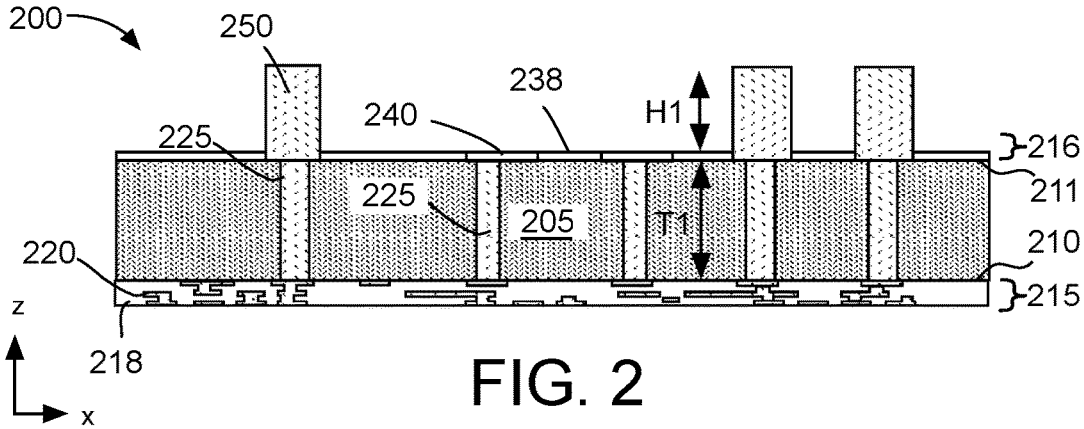
FIG. 2 illustrates a cross-sectional view of an interposer, in accordance with some embodiments.

FIG. 2 is a cross-sectional illustration of one interposer 200 that may be received as a starting material. Although only one interposer 200 is illustrated, interposer 200 may be one of multiple interposers of a monolithic wafer or reconstituted panel suitable for wafer-level or panel-level assembly. Interposer 200 comprises a substrate material 205 of thickness T1. In some examples, substrate material 205 is silicon. In other examples, substrate material 205 is an alternative crystalline material, such as, but not limited to, germanium, $Si_xGe_{1-x}$, or silicon carbide. In still other examples, substrate material 205 is glass, which can have flatness approximately equal to that of crystalline substrates, but often at lower cost. Thickness T1 may vary, but in some embodiments is at least 100 μm and may be in the range of 200-800 μm, or more. For embodiments where substrate material 205 is silicon, or another suitable semiconductor material, interposer 200 may be "active" and include transistors fabricated in substrate material 205. For such embodiments, interposer 200 may be considered a host IC die. Alternatively, interposer 200 may be "passive" without any transistors fabricated in substrate material 205. Regardless of whether interposer 200 is an active or passive interposer, interposer 200 may include passive devices such as resistors, capacitors, or inductors (not depicted).

Interposer 200 includes one or more back-end-of-line (BEOL) metallization layers 215 on a first (e.g., front) interposer side 210. In exemplary embodiments, metallization layers 215 include metallization features 220 embedded within a dielectric material 218. While metallization features 220 may have any composition(s) of sufficient electrical conductivity, in exemplary embodiments, metallization features 220 are predominantly copper (Cu). In other examples, metallization features 220 are predominantly other than Cu, such as, but not limited to predominantly Ru, or predominantly W. An uppermost one of metallization layers 215 includes metallization features 220 that have an associated feature pitch suitable for directly bonding to complementary conductive features of an IC die. This feature pitch may range from 100 nm to several microns, for example.

Dielectric material 218 may similarly have any composition(s) suitable as an electrical insulator. In exemplary embodiments, dielectric material 218 is an inorganic interlayer dielectric (ILD) material having any material composition known to be suitable as an insulator of monolithic integrated circuitry, such as, but not limited to, silicon dioxide, silicon nitride, silicon oxynitride, or a low-k material having a relative permittivity below 3.5. In some embodiments, ILD materials between metallization layers
215 vary in composition with a lower ILD material 218
comprising a low-k dielectric material and an uppermost
ILD material 218 comprising a conventional dielectric mate-
rial (e.g., having a dielectric constant of approximately 3.5,
or more). Confining low-k dielectric materials distal from a
bond interface in this manner may advantageously improve
bond strength and/or quality. In other embodiments where
low-k dielectric material is able to form a strong bond
interface, all layers of ILD material 218 may be a low-k
material (e.g., having a relative permittivity of 2.5-3.0).

As further illustrated, interposer 200 further includes one
or more metallization layers 216 over interposer side 211.
Metallization layers 216 include metallization features 240
embedded within a dielectric material 238. Interposer 200
therefore includes both front side and back side metalliza-
tion levels. Dielectric material 238 has any composition(s)
suitable as an electrical insulator. In exemplary embodi-
ments, dielectric material 238 is an inorganic ILD, such as
any of those described for dielectric material 218. Alterna-
tively, dielectric material 218 may be an organic material,
such as a cured (e.g., thermoset) resin or polymer compris-
ing epoxy and/or silicone. Metallization features 240 may
have any composition of suitable conductivity, and may, for
example, have any of the composition(s) described for
metallization features 220. In some embodiments, metalli-
zation features 240 are predominantly Cu. Metallization
features 240 have an associated feature pitch suitable for
directly bonding to complementary conductive features of
an IC die. This feature pitch may range from 100 nm to
several microns, for example. Although only one level of
metallization features 240 are illustrated, metallization lay-
ers 216 may comprise more than one level of metallization
features.

Interposer 200 further comprises a plurality of electrically
conductive through-substrate vias (TSVs) 225, which extend
through the thickness T1 of substrate material 205 from
interposer side 210 to an opposite interposer (e.g., back) side
211. For embodiments where substrate material 205 is glass,
through vias 225 may be more specifically referred to as
through-glass vias (TGVs). Through vias 225 may comprise
any material of sufficient electrical conductivity, and may
be, for example, predominantly Cu. Each through via 225 is
electrically coupled with one or more metallization features
of metallization layers 215. Through vias 225 may also be
electrically coupled with one or more metallization features
of metallization layers 216.

In the illustrated embodiment, a conductive pillar 250
extends from interposer side 211 and is electrically coupled
to one or more through vias 225. Hence, in contrast to
metallization features 240, which are embedded within
dielectric material 238, pillars 250 extend a height H1 from
a hybrid surface comprising both metallization features 240
and dielectric material 238. Pillar height H1 may be nearly
equal to the thickness of substrate material 205, or even
greater. Pillar height H1 may be at least as tall as a thickness
of an IC die that is to be bonded to the hybrid surface
comprising dielectric material 238 and metallization fea-
tures 240. In some examples, pillar height H1 is at least 50
μm, and may be over 100 μm. Pillars 250 may be fabricated
according to a semi-additive process (SAP), for example
with Cu electroplated within a plating mask, and the plating
mask removed following the plating.

Returning to FIG. 1, methods 100 continue at input 112
where IC die are received. The IC die may have any
dimensions and any functionality. The IC die received at
input 112 may be fully functional ASICs, or may be chiplets or tiles that have a more limited functionality supplementing
the function of one or more other IC die. A chiplet or tile
may, for example, be any of a wireless radio circuit, micro-
processor core, electronic memory circuit, floating point
gate array (FPGA), power management and/or power supply
circuit, or include a MEMS device. In some other examples,
the IC die received at input 112 includes one or more banks
of active repeater circuitry to improve multi-chip package
interconnects (e.g., network-on-chip architectures). A
repeater bank may, for example, support 2000+ signals
within an IC die area of 0.4 mm². In other examples, the IC
die received at input 112 may include clock generator
circuitry or temperature sensing circuitry. In other examples,
the IC die received at input 112 may include one or more
ESD banks. In still other examples, the IC die received at
input 112 includes a second level of logic circuitry that,
along with other IC die received at input 112, implements
3D circuitry (e.g., mesh network-on-chip architectures).

Figure 3:
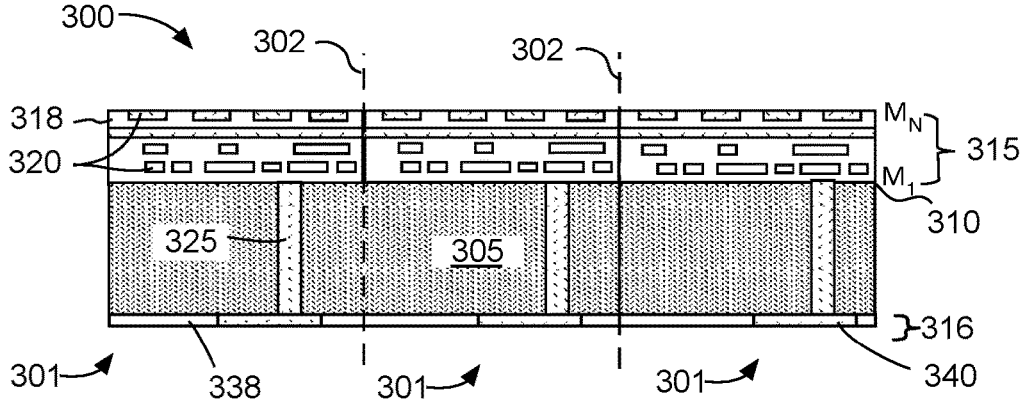
FIG. 3 illustrates a cross-sectional view of a wafer comprising a plurality of IC die, in accordance with some embodiments.

FIG. 3 is a cross-sectional illustration of an IC die wafer
300 that may be received as a starting material at input 112
(FIG. 1), and/or fabricated in a monolithic IC process
upstream of methods 100. As shown in FIG. 3, wafer 300
comprises a plurality of IC die 301 that are to be singulated
along scribe lines 302. Each IC die 301 includes at least one
IC die device layer 310 that is between a die substrate
material 305, and one or more BEOL metallization layers
315 that have been monolithically fabricated over device
layer 310. Die substrate material 305 may be homogenous
with device layer 310, or not (e.g., a transferred substrate).
In wafer form, die substrate material 305 may have any
thickness T_D, for example following a thinning process
following the fabrication of IC die 301. In some exemplary
embodiments, thickness T_D is between 50 and 200 μm.

IC die device layer 310 (and a homogeneous IC die
substrate material 305) may include any semiconductor
material such as, but not limited to, predominantly silicon
(e.g., substantially pure Si) material, predominantly germa-
nium (e.g., substantially pure Ge) material, or a compound
material comprising a Group IV majority constituent (e.g.,
SiGe alloys, GeSn alloys). In other embodiments, the semi-
conductor material is a Group III-V material comprising a
Group III majority constituent and a Group IV majority
constituent (e.g., InGaAs, GaAs, GaSb, InGaSb). IC die
device layer 310 may have a thickness of 100-1000 nm, for
example. IC die device layer 310 need not be a continuous
layer of semiconductor material, but rather may include
active regions of semiconductor material surrounded by field
regions of isolation dielectric.

During front-end-of-line (FEOL) processing, active and/
or passive devices are fabricated in IC die device layer 310
at some device density associated with some device pitch. In
some embodiments, the active devices are field effect tran-
sistors (FETs) with a device pitch of 80 nm, or less. The
FETs may be of any architecture (e.g., planar, non-planar,
single-gate, multi-gate). In some embodiments, FET termi-
nals have a feature pitch of 40-80 nm. Additionally, or in the
alternative, IC die device layer 310 may include active
devices other than FETs. For example, IC die device layer
310 may include electronic memory structures, such as
magnetic tunnel junctions (MTJs), or the like. In addition to
active devices, or instead of active devices, IC die device
layer 310 may include passive devices (e.g., resistors,
capacitors, inductors, etc.).

During back-end-of-line (BEOL) processing, active
devices of IC device layer 310 are interconnected into IC
circuitry with M₁-M_N metallization layers 315. In some
examples where IC die device layer 310 includes both n-type and p-type FETs, the FETs are interconnected by metallization layers 315 into a CMOS circuitry. Metallization layers 315 may comprise any number of metallization features 320 separated by ILD material 318. Metallization features 320 may have any of the compositions described above for interposer metallization features 220, for example. In some embodiments where metallization features 220 are predominantly Cu, metallization features 320 are also predominantly Cu. ILD material 318 may similarly have any of the compositions described above for ILD 218, for example.

As illustrated in FIG. 3, IC die 301 further includes back-side metallization features 340 embedded within a dielectric material 338. IC die 301 therefore includes both frontside and backside metallization levels. Dielectric material 338 have any composition(s) suitable as an electrical insulator. In exemplary embodiments, dielectric material 338 is an inorganic ILD, such as any of those described for dielectric material 218. Alternatively, dielectric material 338 may be an organic material, such as a cured (e.g., thermoset) resin or polymer comprising epoxy and/or silicone. Metallization features 340 may have any composition of suitable conductivity, and may, for example, have any of the composition(s) described for metallization features 320. In some embodiments, metallization features 340 are predominantly Cu. Metallization features 340 have an associated feature pitch suitable for directly bonding to complementary conductive features of an interposer. This feature pitch may range from 100 nm to several microns, for example. Although only one level of metallization features 340 are illustrated, backside metallization levels 316 may comprise more than one level of metallization features.

In accordance with some embodiments, IC die 301 further includes IC die through vias 325 passing through substrate material 305 and interconnecting one or more frontside metallization features 320 with backside metallization features 340. For embodiments lacking IC die through vias 325, electrical interconnection to device layer 310 may be exclusively through frontside metallization features 320, as further described below.

Returning to FIG. 1, methods 100 continue at block 115 where IC die received at input 112 are attached to a first side of the interposer received at input 110. At block 120, a package insulator (dielectric) is then formed over the first side of the interposer and around the attached IC die. For embodiments where the interposer comprises conductive pillars extending from the first side of the interposer, the IC die are positioned within spaces between the pillars. Metal features on the back side of the IC die are aligned to corresponding metal features on the first side of the interposer. The feature pitch at the die-interposer interface metallization accommodates chiplet-host alignment imprecision. The feature pitch of the metal features on the IC die and interposer may therefore be predetermined based on alignment capabilities.

IC die attachment may comprise any alignment and bonding process suitable for the die. For example, an IC die of a relatively large edge size may be handled and aligned to a target location on the host IC wafer according to pick-and-place die assembly methods and systems. Many such methods and systems can handle an object as thin as 100 μm and with edge lengths ranging from tens of millimeters down to ~200 μm. Die attachment at block 115 may also comprise one or more micro device assembly techniques including so-called transfer printing methods, which are capable of handling an object as thin as 1 μm and having lateral dimensions in the tens of micrometers. Such micro device assembly techniques may rely on a MEMS microtool that includes hundreds or even thousands of die attachment points. Micro device assembly methods and systems suitable for inorganic LED (iLED) technology, for example, may be employed at block 115 to transfer a plurality of IC chip(let)s concurrently from a source IC die substrate to multiple interposers arrayed within a wafer or panel.

The IC die may be aligned to a target location on the interposer with any high-resolution alignment tool, for example of the type found on a wafer-level or chip-level bonding tool commercially available through EVG, SUSS, or TEL, any of which may be employed at block 115. Alignment capability continues to advance, having improved from +/−5 μm to +/−0.2 μm over recent years. Once adequately aligned, a back side of the IC die may be bonded to the first side of the interposer with any direct bonding technique(s) suitable for the IC die and interposer interfaces.

Figure 4:
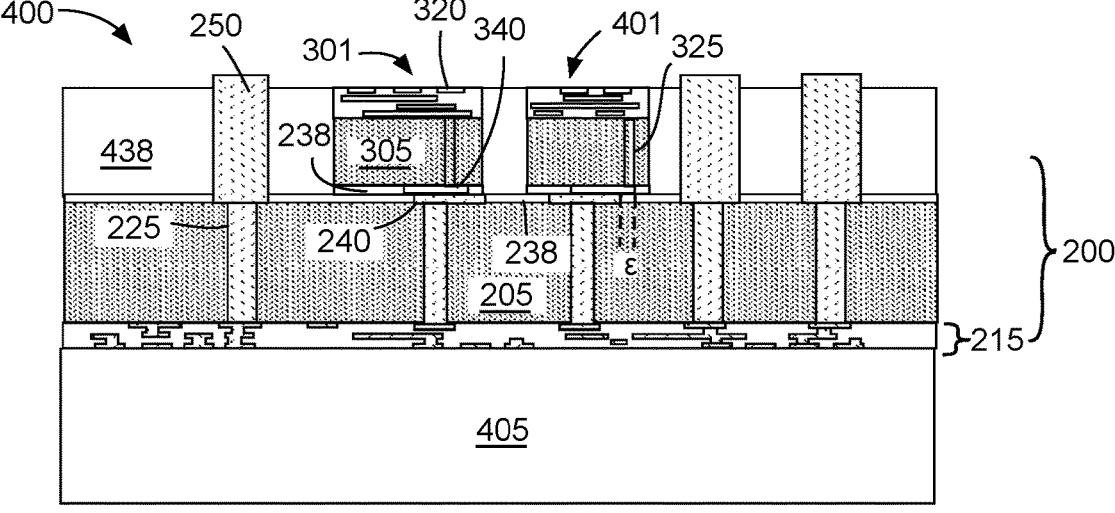
FIG. 4 illustrates a cross-sectional view of a composite IC die package including a first IC die bonded to a first side of an interposer, in accordance with some embodiments.

FIG. 4 illustrates a cross-sectional view of a composite IC die package 400 including IC die 301 and another IC die 401 bonded to a first side of interposer 200, in accordance with some embodiments. IC die 401 may have any of the circuitry described above for IC die 301 with the different reference number employed to emphasize the two IC die may have wholly different architectures and/or functions. During the bonding process, interposer 200 may be supported by any bonding substrate 405, such as a wafer or panel. Direct bonding of IC die 301, 401 may be metal-to-metal, for example, during which metallization feature 340 in of IC die 301 sinters with metallization feature 240 on the first side of interposer 200. In some embodiments, the backside of the IC die 301 is bonded to the interposer through a hybrid bond formed both between metallization features 240 and 340 (e.g., via metal interdiffusion) and between dielectric materials 238 and 338 (e.g., via Si—O—Si condensation bonds). Thermo-compression bonding may be at low temperature (e.g., below melting temperature of the interconnects, and more specifically below 100° C.). Direct bonding at room temperature (i.e., compression only) is also possible. Prior to bonding, either or both of interposer 200 or the back side of IC die 301 may be pre-processed, for example with a plasma clean, to activate their surfaces for the bonding. Post bonding, selective heating may be performed to make permanent the bond (e.g., by converting a van der waals bond into a sintered Cu—Cu bond through interdiffusion). For selective heating, a laser may be employed to limit heating to IC die 301 and/or specific locations of interposer 200.

Any number of additional IC die, such as IC die 401, may be similarly bonded to other locations on the first side of interposer 200 adjacent to conductive pillars 250. As a result of non-zero alignment tolerances, metallization features 240 may be laterally offset from metallization features 340. In some embodiments, lateral (e.g., x-axis) misalignment or misregistration ε between conductive features is less than 0.2 μm. For example, lateral misalignment between one metallization feature 340 (e.g., a line or trace) and another conductive feature 340 (e.g., a via) may be at least an order of magnitude smaller than lateral misalignment ε between metallization features 240 and 340. The lateral dimensions of metallization features 240 and 340 is sufficiently large to accommodate such lateral offset, as illustrated in FIG. 4. Where multiple IC die (e.g., 301 and 401) are bonded individually to interposer 200, the magnitude of the lateral offset may vary between die. When multiple IC die are bonded concurrently, the magnitude of the lateral offset may be substantially the same for all IC die.

In the example illustrated in FIG. 4, IC die metallization features 320 are electrically coupled to interposer 200 through IC die through vias 325. Interposer through vias 225 further electrically interconnect IC die 301, 401 to interposer frontside metallization layers 215. A package dielectric 438 is formed around pillars 250 and IC die 301, 401. Package dielectric 438 may be an organic material, such as any of those described above, and may be applied, for example, with a molding process or with a dry film lamination process. The height of pillars 250 maybe predetermined, for example, to be approximately equal to the z-height of one or more of IC die 301 and 401 so that a top surface of pillars 250 and IC die metallization features 320 can be further processed. In some alternative embodiments where pillars 250 are absent from interposer 200, pillars 250 may be instead plated within openings made in package dielectric 438 that expose through vias 225, for example according to any through-package via (TPV) fabrication technique.

Returning to FIG. 1, methods 100 continue at block 125 where one or more layers of metallized redistribution features are built up over the first side of the bonded IC die. Any suitable semi-additive processing (SAP) may be practiced at block 125, for example. The metallized redistribution layer (RDL) features formed at block 125 are to interconnect features the front side of the boded IC die and provide routing that terminates at metallization features suitable as first-level interconnect (FLI) interfaces. The RDL features formed at block 125 may therefore electrically interconnect a plurality of IC die bonded to the first side of the interposer, and/or fan-out metallization features from a pitch of the IC die to a pitch suitable for FLI interconnects. The RDL features formed at block 125 may also interconnect any of the conductive pillars present on the first side of the inter-poser, for example to interface the pillars to FLI intercon-nects. For embodiments where a bonded IC die lacks through vias, the RDL features formed at block 125 may also interconnect the IC die to any of the conductive pillars present on the first side of the interposer, and those pillars may further interconnect to through vias of the interpose that are electrically coupled to metallization on the opposite side of the interposer. That metallization, in turn, may intercon-nect to a front side of the bonded IC die so that the metallization formed at block 125 may provide an electrical pathway to the bonded IC die that will further support bonding of additional die to the RDL.

Figure 5:
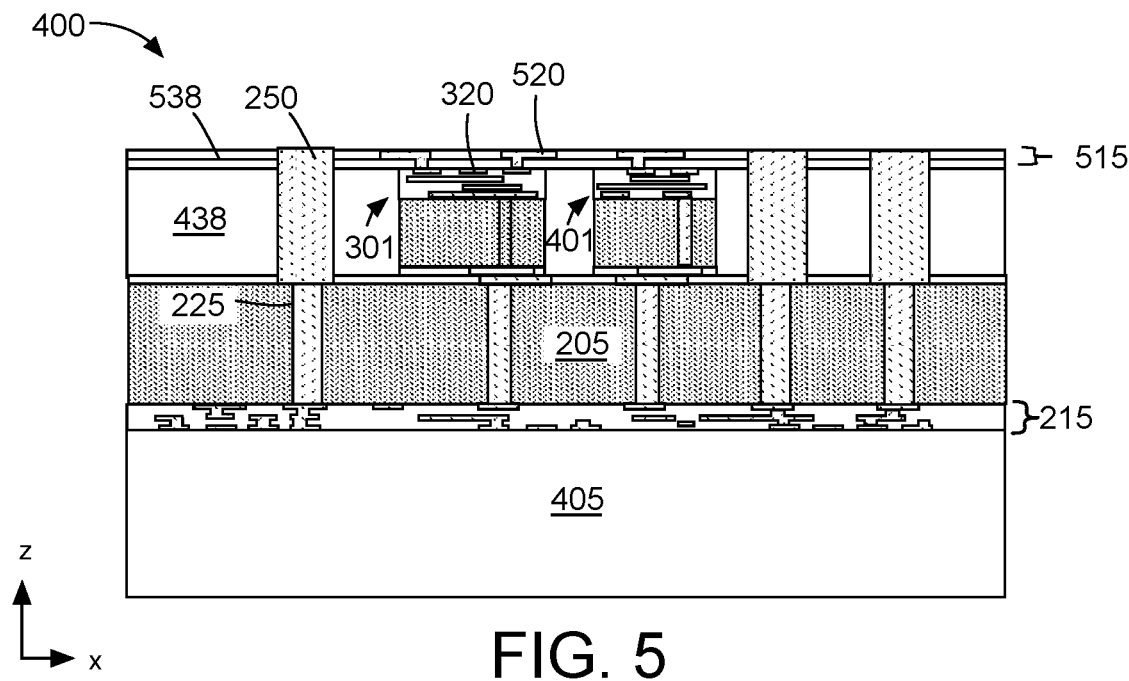
FIG. 5 illustrates a cross-sectional view of the IC die package illustrated in FIG. 4 further including redistribution layer features on the first IC die, in accordance with some embodiments.

FIG. 5 illustrates a cross-sectional view of package 400 following formation of RDL structure 515. In this example, RDL structure 515 includes metal RDL features 520 embed-ded within one or more layers of package dielectric 538. RDL features 520 are electrically connected to various IC die metallization features 320 on the frontside of the IC die 301, 401. RDL structure 515 may interconnect IC die 301 to IC die 401 and/or fan-out IC die metallization features 320 to a larger pitch associated with IC die RDL features 520. RDL structure 515 may also interconnect the IC die 301 a conductive pillar 250, which is further interconnected to a conductive through via 225 that is electrically coupled to metallization 215. Hence, conductive pillars 250 may serve as an IC die I/O path and/or IC die power delivery path.

RDL features 520 may have any composition suitable for the purpose, such as any of the metals described above for metallization features 240, 340, or 320. Package dielectric 538 may similarly have any composition suitable for the purpose, such as an organic material that may have the same composition as package dielectric 438. In some exemplary embodiments where a semi-additive process is practiced, a layer of package dielectric 438 is first laminated upon package 400. Openings are then formed in package dielec-tric 438, and RDL features 520 plated into the openings. In some embodiments therefore, RDL features 520 may be predominantly Cu. As needed, pillars 250 may be similarly built up, or otherwise augmented, with RDL structure 515.

Returning to FIG. 1, methods 100 continue at block 130 where the interposer is transferred between carriers. The carrier transfer entails affixing a carrier over the RDL structure, and removing any carrier that was affixed to the other side of the interposer. One or more second IC die received at input 132 may then be attached to the exposed second side of the interposer. The IC die received at input 132 may also be fully functional ASICs, or may be chiplets or tiles that have a more limited functionality supplementing the function of one or more other IC die. In exemplary embodiments, the frontside of the IC die are attached to the interposer. In this "flipped chip" configuration, a direct bond may be formed between metallization features on a front of the IC die and corresponding ones of metallization features on the interposer. Any number of IC die may be attached at block 135 by any suitable technique. In exemplary embodi-ments, the IC die are attached through direct bonding, which may be hybrid bonding, and substantially as described above for block 115.

Figure 6:
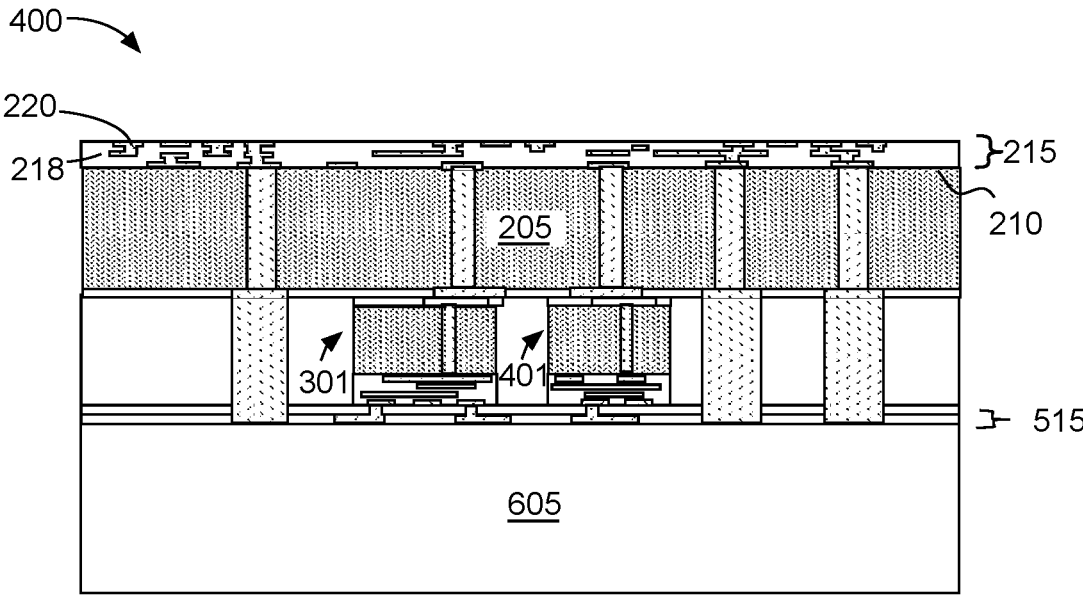
FIG. 6 illustrates a cross-sectional view of the IC die package illustrated in FIG. 5 with a second side of the interposer exposed, in accordance with some embodiments.
Figure 7:
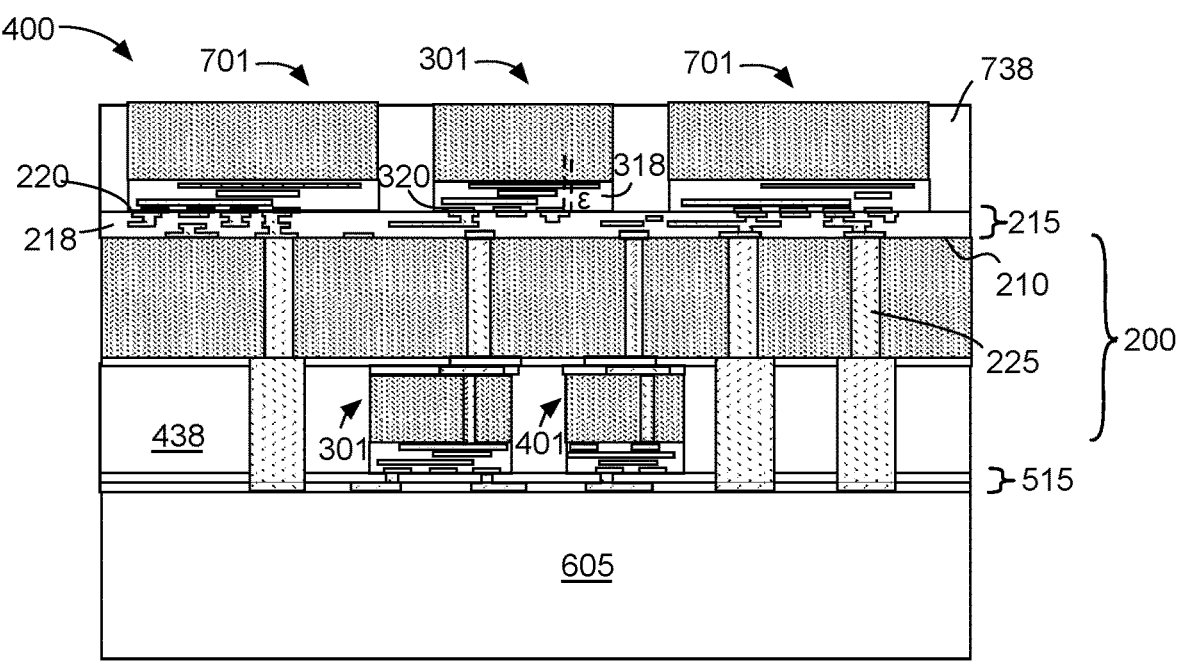
FIG. 7 illustrates a cross-sectional view of the IC die package illustrated in FIG. 6 with a second IC die bonded to the second side of the interposer, in accordance with some embodiments.

FIG. 6 illustrates a cross-sectional view of composite IC die package 400 with a carrier 605 affixed over RDL structure 515. Bonding substrate 405 has been removed, exposing metallization layers 215 on (e.g., front) interposer side 210. As further illustrated in FIG. 7, additional IC die, for example including another IC die 301, and/or one or more other IC die 701 are directly bonded to metallization layers 215. At this point, composite IC die package 400 may be referred to as a double-sided composite IC die package. FIG. 7 illustrates one example where the same IC die 301 is bonded to two sides of interposer 200. However, the IC die bonded on one side of interposer 200 may all be distinct from those bonded to the other side. For example, one or more IC die 701, which have different circuitry than that of IC die 301 or 401, may be bonded to the second side of interposer 200. As for IC die 401, IC die 701 may, for example, have any of the circuitry described above for IC die 301.

Attachment of IC die 301, 701 may comprise any align-ment and bonding process suitable for the die. For example, pick-and-place or micro device assembly technique may be practiced. IC die 301, 701 may be aligned to a target location on interposer 200, for example with an IC die metallization feature 320 in direct contact with interposer metallization feature 220. IC dielectric material 318 may be similarly in direct contact with interposer dielectric material 218. Some non-zero lateral misalignment tolerance ε may again be evident as an offset between metallization features 220 and 320. As illustrated, IC die 301 and 701 are coupled to pillars 250 through interposer metallization layer 215. Following the attachment of IC die 301, 701 another package dielectric 738 is applied. Package dielectric 738 may have any suitable composition, such as an organic epoxy, and may be formed by any technique, such as molding or lamination.

As shown in FIG. 7, vias through IC die 301, 401 interconnect IC die 301, 401 to IC die 301, 701. In alterna-tive embodiments where IC die 301, 401 lack through vias, IC die 301, 401 interconnect to IC die 301, 701 through metallization layers 215, through interposer vias 225, pillars 250 and RDL structure 515.

Figure 8:
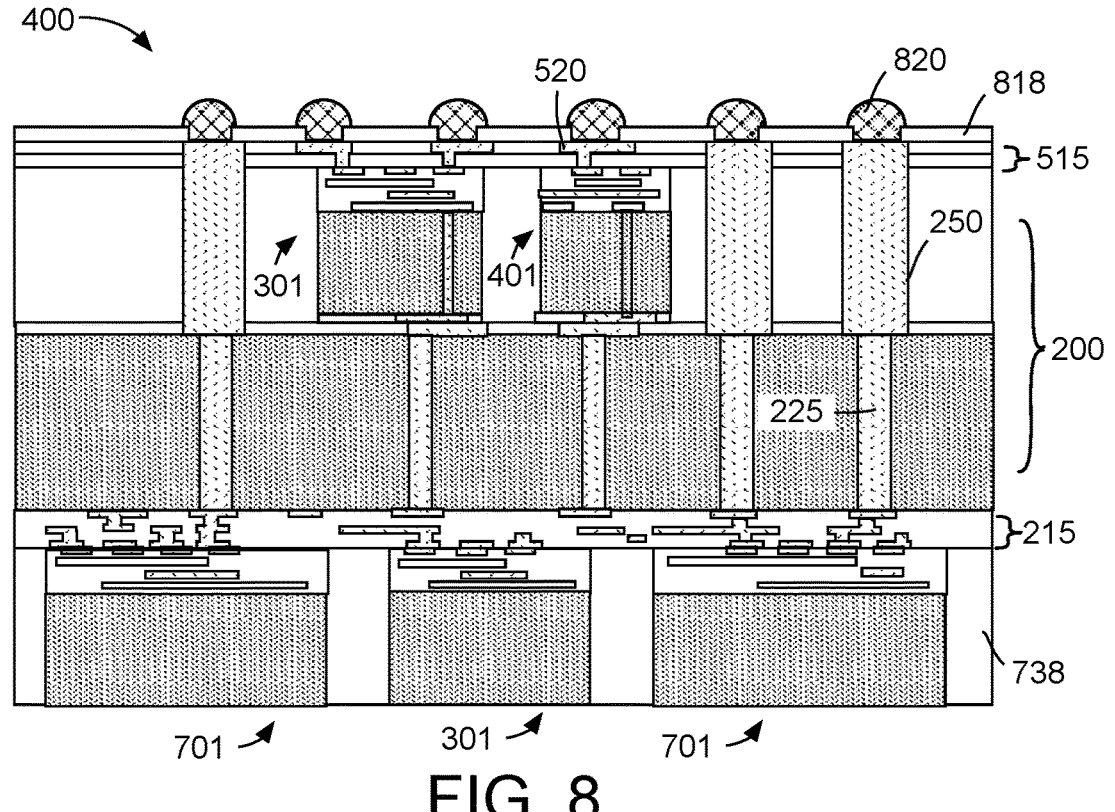
FIG. 8 illustrates a cross-sectional view of the package illustrated in FIG. 7 with first-level interconnects (FLI) on the first side of the IC die package, in accordance with some embodiments.

Returning to FIG. 1, methods 100 continue at block 140 where any carrier covering the RDL structure is removed, and FLI features of the composite package formed. Methods 100 then complete at output 145 where the composite IC die package is assembled to a host component, such as, but not limited to, a package substrate, or printed circuit board. In the example shown in FIG. 8, carrier 605 has been removed, and a solder mask 818 applied over RDL structure 515. Interconnect features 820 (e.g., microbumps) having any composition (e.g., SAC) may be applied by any technique to RDL features 520, as well as to conductive pillars 250. Non-solder embodiments are also possible where RDL features 520 and pillars 250 are to be directly bonded (e.g., Cu—Cu bumps) to a host component.

Figure 9:
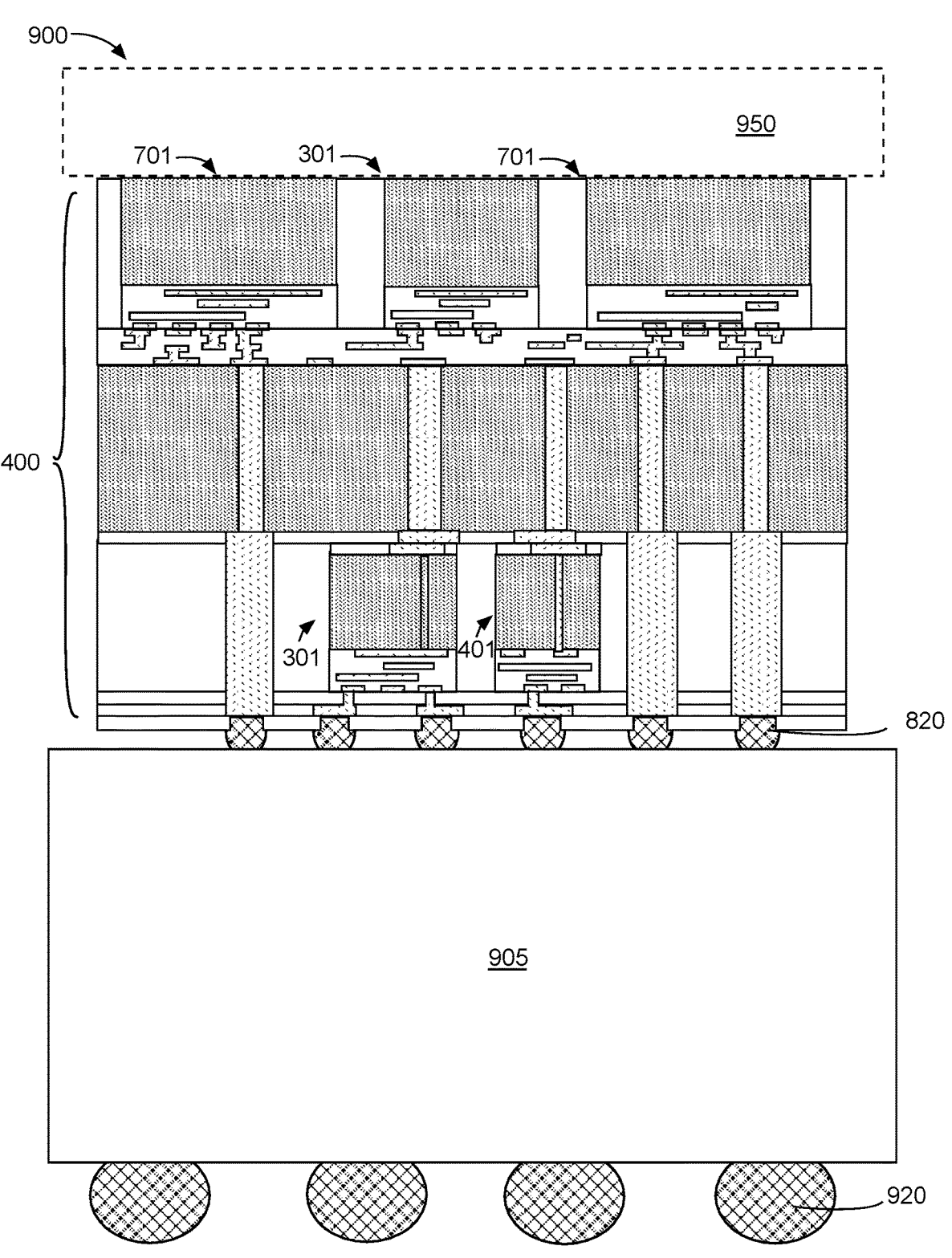
FIG. 9 illustrates a system including the IC die package illustrated in FIG. 8 attached to a host component with FLI, in accordance with some embodiments.

FIG. 9 illustrates composite IC die package 400 integrated into a system 900 further comprising a host component 905. In some embodiments host component 905 is predominantly silicon. Host component 905 may also comprise one or more alternative materials known to be suitable as interposers or package substrates (e.g., an epoxy preform, etc.). Host component 905 may include one or more metallized redistribution levels (not depicted) embedded within a dielectric material. Host component 905 may also include one or more IC die embedded therein. For example, an IC interconnect bridge (not depicted) may be embedded within metallized redistribution levels of host component 905, for example to electrically couple composite IC die package 400 to another IC, such as a memory IC die (not depicted) or another composite IC die package (not depicted).

As further shown in FIG. 9, host component 905 (e.g., a package substrate) is coupled to composite package 400 by FLI interconnects 820, and may be further coupled another host, such as a mother board or other PCB, by second level interconnects (SLI) 920. SLI 920 may comprise any solder (ball, bump, etc.) suitable for a given host board architecture (e.g., surface mount FR4, etc.). As illustrated in dashed line, one or more heat spreaders and/or heat sinks 950 may be further coupled to backsides of IC die 301 and/or 701, which may be advantageous where circuitry of one or more such die dissipate significant power, for example where IC die 301 and/or 701 comprises a CPU core.

Figure 10:
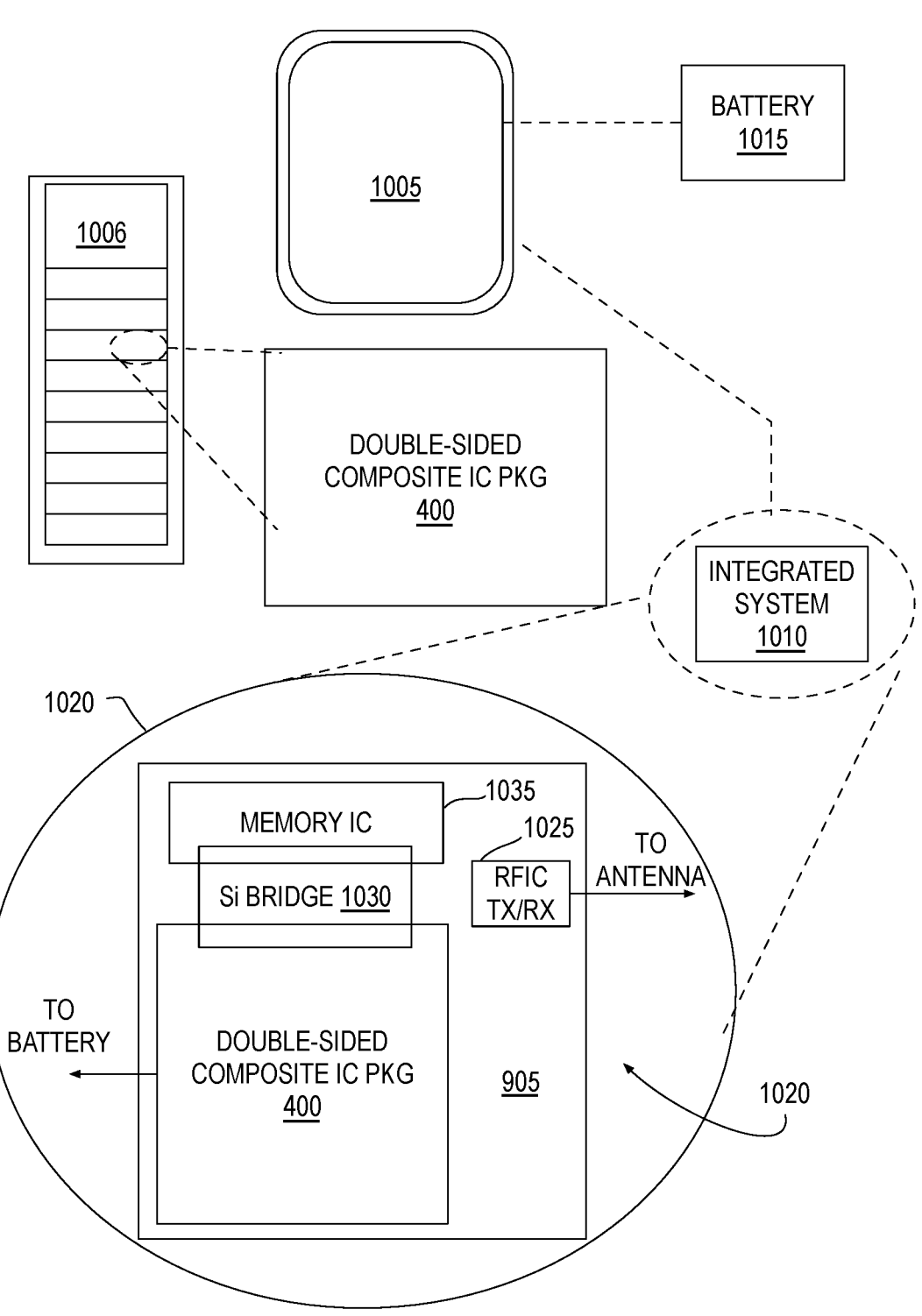
FIG. 10 illustrates a mobile computing platform and a data server machine employing a composite IC die package, in accordance with some embodiments.

FIG. 10 illustrates a mobile computing platform 1005 and a data server machine 1006 employing a composite IC die package including IC die on two sides of an interposer, for example as described elsewhere herein. Server machine 1006 may be any commercial server, for example including any number of high-performance computing platforms disposed within a rack and networked together for electronic data processing, which in the exemplary embodiment includes a double-side composite IC die package 400 that includes an IC die bonded to a first side of an interposer and an IC die bonded to a second side of the interposer, for example as described elsewhere herein. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), an integrated system 1010, and a battery 1015.

As illustrated in the expanded view 1020, double-sided composite package 400 is further coupled to host component 905, along with one or more memory IC 1035. Memory IC 1035 is interconnected to composite package 400 through a silicon bridge 1030. An RF (wireless) integrated circuit (RFIC) 1025 including a wideband RF (wireless) transmitter and/or receiver may be further coupled to host component 905. PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

Figure 11:
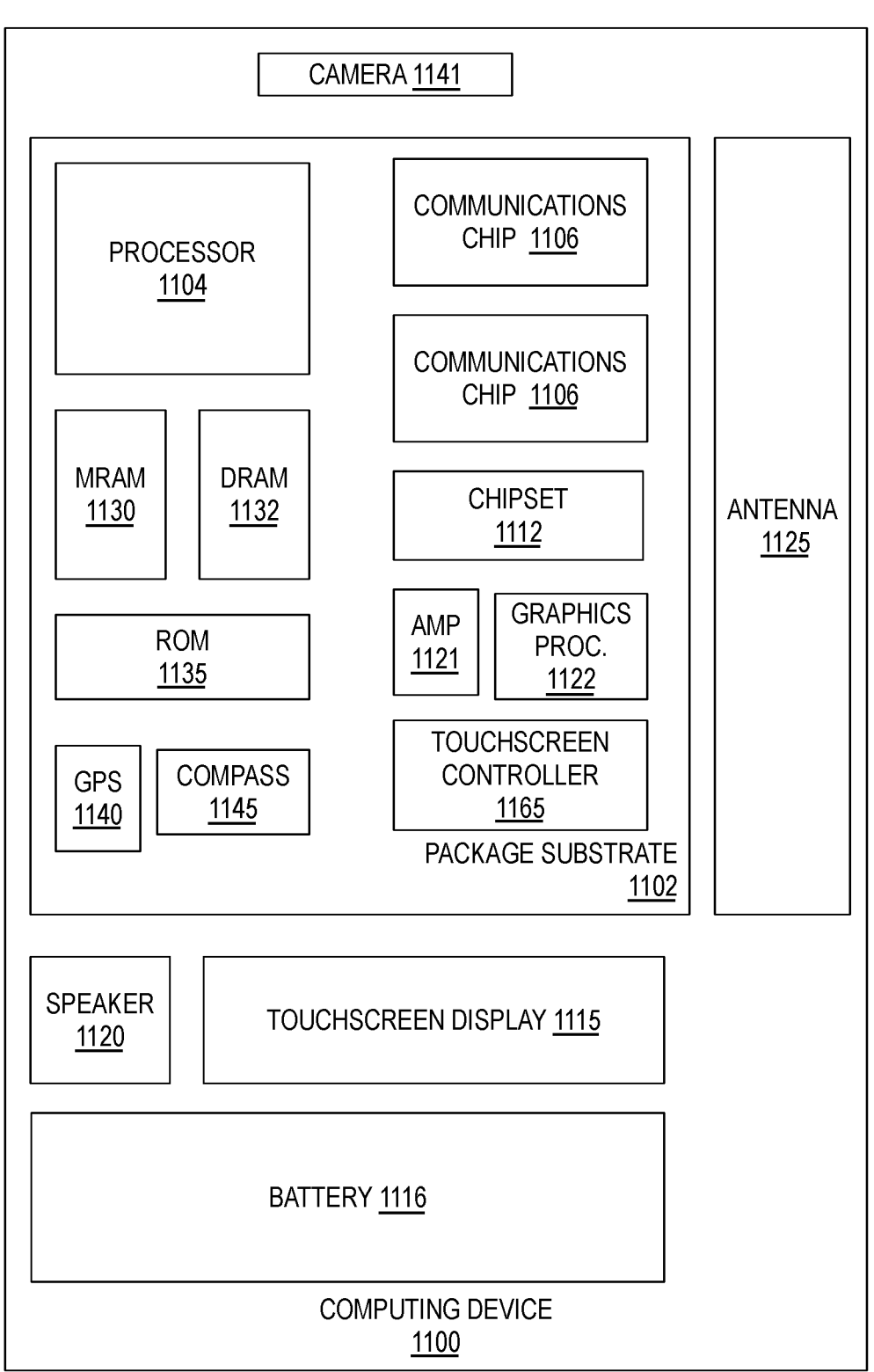
FIG. 11 is a functional block diagram of an electronic computing device, in accordance with some embodiments.

FIG. 11 is a functional block diagram of an electronic computing device 1100, in accordance with an embodiment of the present invention. Computing device 1100 may be found inside either mobile computing platform 1005 or server machine 1006, for example. Device 1100 further includes a package substrate 1102 hosting a number of components, such as, but not limited to, a processor 1104 (e.g., an applications processor). Processor 1104 may be physically and/or electrically coupled to package substrate 1102. In some examples, processor 1104 is within a composite IC die package including IC die on both sides of an interposer, for example as described elsewhere herein. Processor 1104 may be implemented with circuitry in any or all of the IC die of the composite IC die package. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the package substrate 1102. In further implementations, communication chips 1106 may be part of processor 1104. Depending on its applications, computing device 1100 may include other components that may or may not be physically and electrically coupled to package substrate 1102. These other components include, but are not limited to, volatile memory (e.g., DRAM 1132), non-volatile memory (e.g., ROM 1135), flash memory (e.g., NAND or NOR), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth), or the like. In some exemplary embodiments, at least two of the functional blocks noted above are within a composite IC die package structure including a IC die bonded to two sides of an interposer, for example as described elsewhere herein. For example, processor 1104 be implemented with circuitry in an IC die on a first side of the interposer, and an electronic memory (e.g., MRAM 1130 or DRAM 1132) may be implemented with circuitry in an IC die on a second side of the interposer.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, a method of assembling an integrated circuit (IC) package comprises receiving an interposer with one or more through vias and routing metallization on at least a first side of the interposer. The method comprises directly bonding a second side of the interposer to a backside of a first IC die, and forming an insulator over the first IC die. The method comprises forming metal redistribution layer (RDL) features over the insulator and electrically coupled to a frontside the first IC die. The RDL features and the through vias terminate at first-level interconnect interfaces. The method comprises electrically coupling a second IC die to the through via by directly bonding the frontside of the second IC die to the routing metallization.

In second examples, for any of the first examples individual ones of the through vias are coupled to corresponding ones of a plurality of conductive pillars on the second side of the interposer, and the method comprises directly bonding the second side of the interposer to the backside of the first IC die comprises placing the first IC die adjacent to one or more of the plurality of conductive pillars.

In third examples, for any of the first through second examples forming the insulator over the first IC die comprises laminating a dielectric film or applying a mold compound around the first IC die and around the conductive pillars.

In fourth examples, for any of the first through third examples forming the metal RDL features further comprises plating first metal features up from a plurality of metal features on the frontside of the first IC die.

In fifth examples, for any of the fourth examples the first IC die is one of a plurality of first IC die and wherein directly bonding the second side of the interposer to the backside of the first IC die comprises directly bonding each of the plurality of first IC die to the second side of the interposer. Forming the metal RDL features further comprises electrically interconnecting the plurality of first IC die with the metal RDL features.

In sixth examples, for any of the first through fifth examples the second IC die is one of a plurality of second IC die, and wherein directly bonding the first side of the interposer to the frontside of the first IC die comprises directly bonding each of the plurality of second IC die to the routing metallization.

In seventh examples, for any of the first through sixth examples forming the metal RDL features further comprises plating second metal features up from the pillars.

In eighth examples, for any of the first through seventh examples the method comprises attaching a first carrier over the metal RDL features, and exposing the routing metallization by removing a second carrier from the second side of the interposer.

In ninth examples, for any of the eighth examples the method comprises exposing the FLI interfaces by removing the first carrier, and forming solder features in contact with the FLI interfaces.

In tenth examples, for any of the first through ninth examples directly bonding the second side of the interposer to the backside of the first IC die comprises forming a hybrid bond between first metal features embedded within a first dielectric material on the backside of the first IC die and second metal features embedded within a second dielectric material on the second side of the interposer.

In eleventh examples, for any of the tenth examples the first dielectric material that is around the first metal features is in direct contact with the second dielectric material that is around the second metal features, and wherein an interdiffused metallurgical bond joins the first metal features to the second metal features.

In twelfth examples, for any of the first through eleventh examples directly bonding the first side of the interposer to the frontside of the second IC die comprises forming a hybrid bond between third metal features embedded within a third dielectric material on the frontside of the second IC die, and fourth metal features embedded within a fourth dielectric material on the first side of the interposer.

In thirteenth examples, an integrated circuit (IC) die package comprises an interposer with one or more through vias. Routing metallization is on a first side of the interposer. The package comprises a first IC die. A backside of the first IC die comprises a first metal features and the first metal feature is in direct contact with a second metal feature on a second side of the interposer. The package comprises an insulator over the first IC die, and RDL features over the insulator and electrically coupled to third metal features on a frontside of the first IC die. The RDL features and the through vias terminate at first-level interconnect interfaces. The package comprises a second IC die electrically coupled to at least one of the through vias. A frontside of the second IC die comprises fourth metal features in direct contact with fifth metal features of the routing metallization.

In fourteenth examples, for any of the thirteenth examples a first of the through vias are coupled to a corresponding one of a plurality of conductive pillars on the second side of the interposer. The first IC die is adjacent to one or more of the plurality of conductive pillars, and the RDL features and conductive pillars terminate at first-level interconnect interfaces.

In fifteenth examples, for any of the thirteenth through fourteenth examples the first IC die is one of a plurality of first IC die, and the RDL features electrically interconnect the plurality of first IC die.

In sixteenth examples, for any of the fifteenth examples the second IC die is one of a plurality of second IC die, and the routing metallization electrically interconnects the plurality of second IC die, and electrically couples each of the plurality of second IC die to one or more of the through vias.

In seventeenth examples, for any of the thirteenth through sixteenth examples the first IC die comprises a through via, the first metal feature is coupled to the through via, and is embedded within a first dielectric material on the backside of the first IC die. The second metal feature is embedded within a second dielectric material on the second side of the interposer. The first dielectric material that is around the first metal feature is in direct contact with the second dielectric material that is around the second metal feature, and wherein an interdiffused metallurgical bond joins the first metal feature to the second metal feature.

In eighteenth examples, a system comprises a host component, and an interposer with one or more through vias. Routing metallization is on a first side of the interposer. The system comprises a first IC die. A backside of the first IC die comprises a first metal feature and the first metal feature is in direct contact with a second metal feature on a second side of the interposer. The system comprises an insulator over the first IC die. Metal redistribution layer features are over the insulator and electrically coupled to third metal features on a frontside of the first IC die. The RDL features and the through vias terminate at first-level interconnect interfaces. The system comprises solder features interconnecting the FLI interfaces to the host component. The system comprises a second IC die electrically coupled to at least one of the through vias. A frontside of the second IC die comprises fourth metal features in direct contact with fifth metal features of the routing metallization.

In nineteenth examples, for any of the eighteenth examples the system further comprises a power supply coupled to the host component to power the first and second ID die.

In twentieth examples, for any of the eighteenth through nineteenth examples the first IC die comprises a first of microprocessor core circuitry, wireless radio circuitry, floating point gate array circuitry, power management circuitry, active repeater circuitry, clock generator circuitry, memory circuitry, or input/output buffer circuitry. The second IC die comprises a second of microprocessor core circuitry, wireless radio circuitry, floating point gate array circuitry, power management circuitry, active repeater circuitry, clock generator circuitry, memory circuitry, or input/output buffer circuitry.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die package comprising:
an interposer with one or more first through vias, wherein routing metallization is on a first side of the interposer;
a first IC die, wherein a back side of the first IC die comprises a first metal feature coupled to a second through via within the first IC die, and wherein the first metal feature is in direct contact with a second metal feature on a second side of the interposer;
an insulator over the first IC die, in contact with an edge of the first IC die, and over a portion of the interposer extending beyond the edge of the first IC die;
a plurality of metal redistribution layer (RDL) features over the insulator and electrically coupled to corresponding ones of a plurality of third metal features on a front side of the first IC die, wherein the RDL features and the first through vias terminate at first-level interconnect interfaces; and
a second IC die electrically coupled to at least one of the first through vias, wherein a front side of the second IC die comprises fourth metal features in direct contact with fifth metal features of the routing metallization.

2. The IC die package of claim 1, wherein:
the first metal feature is embedded within a first dielectric material on the back side of the first IC die;
the second metal feature is embedded within a second dielectric material on the second side of the interposer; and
the first dielectric material that is around the first metal feature is in direct contact with the second dielectric material that is around the second metal feature, and wherein an interdiffused metallurgical bond joins the first metal feature to the second metal feature.

3. The IC die package of claim 1, wherein the routing metallization is embedded within an inorganic dielectric material comprising at least two of silicon, oxygen, or nitrogen.

4. The IC die package of claim 1, wherein the second metal feature is adjacent to an inorganic dielectric material comprising at least two of silicon, oxygen, or nitrogen.

5. The IC die package of claim 1, wherein the RDL features are embedded within an organic dielectric material.

6. The IC die package of claim 1, further comprising an organic epoxy adjacent to a side of the second IC die.

7. The IC die package of claim 1, wherein:
a first of the first through vias are coupled to a corresponding one of a plurality of conductive pillars on the second side of the interposer, the conductive pillars extending through the insulator beyond the edge of the first IC die;
the first IC die is adjacent to, and between, two of the plurality of conductive pillars; and
the RDL features terminate at first-level interconnect (FLI) interfaces.

8. The IC die package of claim 7, wherein:
the first IC die is one of a plurality of first IC die; and
the RDL features electrically interconnect the plurality of first IC die.

9. The IC die package of claim 8, wherein:
the second IC die is one of a plurality of second IC die; and
the routing metallization electrically interconnects the plurality of second IC die, and electrically couples each of the plurality of second IC die to one or more of the first through vias.

10. The IC die package of claim 7, further comprising solder features in contact with the FLI interfaces.

11. The IC die package of claim 7, wherein the plurality of conductive pillars have a height at least equal to a thickness of the first IC die.

12. The IC die package of claim 11, wherein the conductive pillars terminate at the FLI interfaces.

13. The IC die package of claim 1, wherein the interposer comprises a substrate of a thickness and the first through vias are through substrate vias extending through the thickness of the substrate.

14. The IC die package of claim 13, wherein the substrate is a crystalline material comprising silicon.

15. The IC die package of claim 13, wherein the substrate is glass.

16. A system comprising:
a host component;
an interposer with one or more first through vias, wherein routing metallization is on a first side of the interposer;
a first IC die, wherein a back side of the first IC die comprises a first metal feature coupled to a second through via within the first IC die, and wherein the first metal feature is in direct contact with a second metal feature on a second side of the interposer;

an insulator over the first IC die, in contact with an edge of the first IC die;

a plurality of metal redistribution layer (RDL) features over the insulator and electrically coupled to corresponding ones of a plurality of third metal features on a front side of the first IC die, wherein the RDL features and the first through vias terminate at first-level interconnect (FLI) interfaces;

solder features interconnecting the FLI interfaces to the host component; and a second IC die electrically coupled to at least one of the first through vias, wherein a front side of the second IC die comprises fourth metal features in direct contact with fifth metal features of the routing metallization.

17. The system of claim 16, further comprising:

a power supply coupled to the host component to power the first and second IC die.

18. The system of claim 16, wherein:

the first IC die comprises a first of microprocessor core circuitry, wireless radio circuitry, floating point gate array (FPGA) circuitry, power management circuitry, active repeater circuitry, clock generator circuitry, memory circuitry, or input/output buffer circuitry; and the second IC die comprises a second of microprocessor core circuitry, wireless radio circuitry, FPGA circuitry, power management circuitry, active repeater circuitry, clock generator circuitry, memory circuitry, or input/output buffer circuitry.

19. The system of claim 16, further comprising a heat spreader or heat sink on a side of the second IC die opposite the host component.

20. The system of claim 16, further comprising second level interconnects (SLI) coupled to a side of the host component opposite the FLI interconnect interfaces, wherein the SLI comprise solder.

* * * * *